(12) United States Patent
Chi et al.

(10) Patent No.: US 11,557,247 B2
(45) Date of Patent: Jan. 17, 2023

(54) DRIVING SUBSTRATE AND DISPLAY PANEL

(71) Applicant: Shanghai Tianma Micro-Electronics Co., Ltd., Shanghai (CN)

(72) Inventors: Xiao Chi, Shanghai (CN); Jujian Fu, Shanghai (CN); Ping An, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/507,514

(22) Filed: Oct. 21, 2021

(65) Prior Publication Data
US 2022/0044624 A1    Feb. 10, 2022

(30) Foreign Application Priority Data
Aug. 30, 2021    (CN) .......................... 202111005989.1

(51) Int. Cl.
G09G 3/32        (2016.01)
(52) U.S. Cl.
CPC ..................................... G09G 3/32 (2013.01)

(58) Field of Classification Search
CPC . H01L 25/0753; H01L 25/167; H01L 27/156; H01L 33/0095; H01L 33/62; G09G 3/32
See application file for complete search history.

(56) References Cited

U.S. PATENT DOCUMENTS

| | | | |
|---|---|---|---|
| 2015/0179978 A1* | 6/2015 | Sato | H01L 51/5209 257/40 |
| 2018/0019220 A1* | 1/2018 | Ryu | H01L 24/11 |
| 2019/0326348 A1* | 10/2019 | Im | H01L 33/0095 |
| 2020/0312939 A1* | 10/2020 | Cheon | H01L 27/3276 |

FOREIGN PATENT DOCUMENTS

CN        110400819 A    11/2019

* cited by examiner

*Primary Examiner* — Muhammad N Edun
(74) *Attorney, Agent, or Firm* — Christensen O'Connor Johnson Kindness PLLC

(57) ABSTRACT

A driving substrate and a display panel are provided. The driving substrate includes driving modules. Each of the driving modules includes two electrodes. Each of at least one of the two electrodes includes convex parts, and each of the convex parts protrudes from one of the two electrodes where the convex parts are located towards the other one of the two electrodes.

19 Claims, 11 Drawing Sheets

DRIVING SUBSTRATE AND DISPLAY PANEL

CROSS-REFERENCE TO RELATED APPLICATIONS

The present application claims priority to Chinese Patent Application No. 202111005989.1, filed on Aug. 30, 2021, the content of which is incorporated herein by reference in its entirety.

TECHNICAL FIELD

The present disclosure relates to the field of display technologies, and, particularly, relates to a driving substrate and a display panel.

BACKGROUND

Light-emitting diodes (LEDs) are widely used in the display field as light-emitting components. LEDs can be used as backlights of liquid crystal display panels. LEDs with smaller size, such as micro-LEDs and nano-LEDs, can be used as pixels in display panels. When the LEDs are used as pixels, a driving substrate is provided to drive the LEDs. Due to limitations in the manufacturing process of the LEDs, it is difficult for LEDs to directly grow on the driving substrate, and thus it is necessary to transfer the manufactured LEDs to the corresponding positions of the driving substrate in batches with transfer technology. However, the transfer technology in the related art has a low transfer accuracy, resulting in inconsistent luminous efficiency between different pixels.

SUMMARY

In a first aspect of the present disclosure, a driving substrate is provided. The driving substrate includes driving modules, and each of the driving modules includes two electrodes. Each of at least one of the two electrodes includes convex parts, and each of the convex parts protrudes from one of the two electrodes where the convex parts are located towards the other one of the two electrodes.

In a second aspect of the present disclosure, a display panel is provided. The display panel includes the above driving substrate and light-emitting diodes (LEDs) located at a side of the driving substrate, and one of the driving modules corresponds to at least one of the LEDs.

BRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. Those skilled in the art may obtain other drawings based on these drawings.

DESCRIPTION OF EMBODIMENTS

In order to more clearly illustrate objects, technical solutions and advantages of embodiments of the present disclosure, the technical solutions in the embodiments of the present disclosure are clearly and completely described below with reference to the accompanying drawings in the embodiments of the present disclosure. The described embodiments are merely part of the embodiments of the present disclosure rather than all of the embodiments. All other embodiments obtained by those skilled in the art shall fall into the scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

Figure 1:
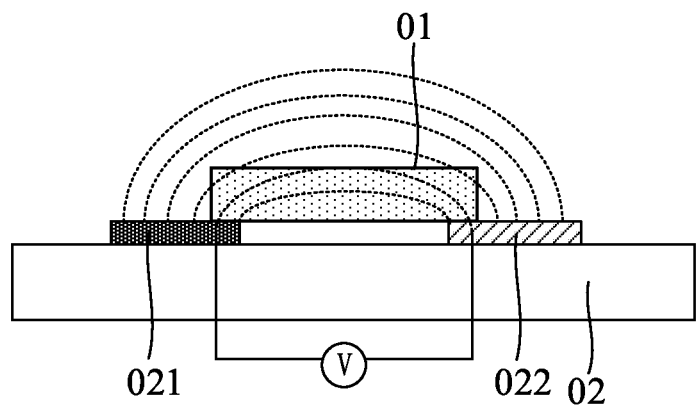
FIG. 1 is a schematic diagram showing a principle of a mass transfer technology in the related art.
Figure 2:
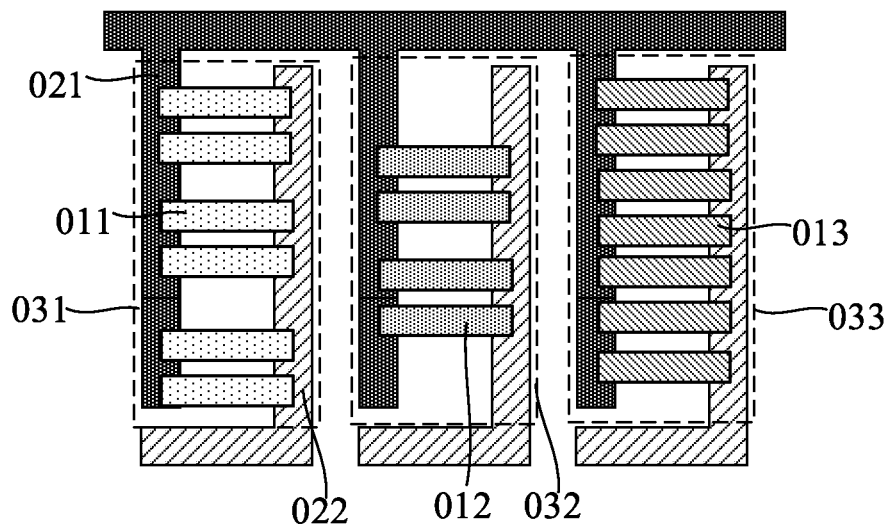
FIG. 2 is a schematic diagram after LED transfer in the related art.

FIG. 1 is a schematic diagram showing a principle of a mass transfer technology in the related art, and FIG. 2 is a schematic diagram after LED transfer in the related art. As shown in FIG. 1, a solution with LED 01 is dropped on a driving substrate 02, and a voltage is applied to the first electrode 021 and the second electrode 022 of the driving substrate 02 to form a potential difference V, so that an electric field can be formed between the first electrode 021 and the second electrode 022. Under the action of the electric field, two electrodes (n-electrode and p-electrode) of the LED 01 are self-aligned with the first electrode 021 and the second electrode 022 respectively, and then the solvent is evaporated to realize transfer of the LED. However, due to the low transfer accuracy of LEDs in the related art, a considerable number of LEDs cannot be perfectly aligned with the first electrode and the second electrode. The problem as shown in FIG. 2 often occurs. The LED 011 that emits a first-color light, the LED 012 that emits a second-color light and the LED 013 that emits a third-color light are illustrated in FIG. 2. After the LED transfer process, a pitch between LEDs of the same color may be unstable, resulting in an unstable shape of the light-emitting region of pixels formed by plurality of LEDs of the same color. In addition, there will also be a problem of large differences in the effective bonding number of LEDs for different pixels. For example, according to an expected design, each pixel needs to be provided with seven LEDs, but after the alignment and the transfer, a first-color pixel 031 has six LEDs 011, a second-color pixel 032 has four LEDs 012, and a third-color pixel 033 has seven LEDs 013. That is, there is a difference between the number of LEDs in the pixel and the preset alignment number, which can cause the luminous efficiency of different pixels to be inconsistent.

Based on the problems in the related art, the present disclosure provides a driving substrate and a display panel. After a plurality of LEDs is transferred to corresponding positions on the driving substrate, the driving substrate and the plurality of LEDs form a display panel, and the driving module can drive the LED to emit light. That is, the display panel provided by the present disclosure includes a driving substrate and a plurality of LEDs located at a side of the driving substrate. The driving module corresponds to at least one of the plurality of LEDs. The LED can have any size in the related art, such as a micro-LED and a nano-LED. In an embodiment of the present disclosure, by improving the structure of the driving module of the driving substrate, the transfer and alignment accuracy of the LED can be improved, thereby improving the uniformity of pixel light emission of the display panel.

Figure 3:
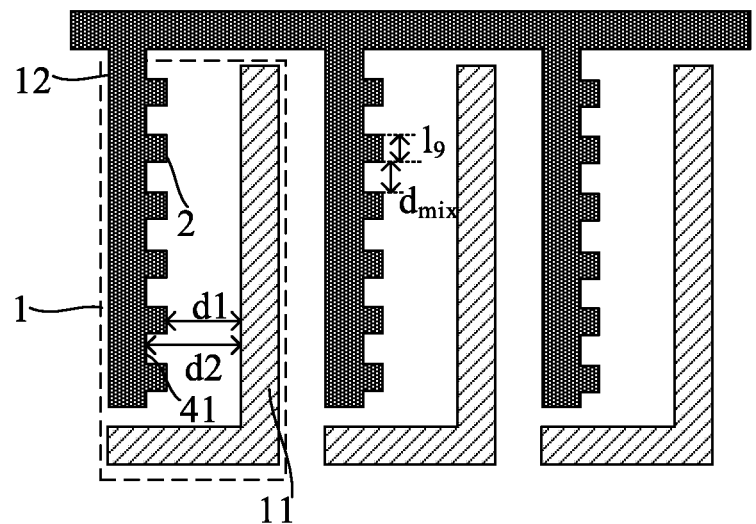
FIG. 3 is a partial schematic diagram showing a driving substrate according to an embodiment of the present disclosure.

FIG. 3 is a partial schematic diagram showing a driving substrate according to an embodiment of the present disclosure. In an embodiment, the driving substrate includes a plurality of driving modules 1. FIG. 3 only illustrates three driving modules 1. As shown in FIG. 3, the driving module 1 includes two electrodes, i.e., a first electrode 11 and a second electrode 12. The second electrode 12 includes convex parts 2 protruding from the second electrode 12 towards the first electrode 1. A part of the second electrode 12 between two adjacent convex parts 2 can be regarded as a concave part of the second electrode 12 that is recessed towards the inside of the second electrode 12. The convex part 2 protrudes to the outside of the second electrode 12. FIG. 3 shows that an edge of the part of the second electrode 12 between two adjacent convex parts 2 is a concave edge 41. It can be understood that a distance d1 between the convex part 2 and the first electrode 11 is smaller than a distance d2 between the concave edge 41 and the first electrode 11.

In application, a plurality of LEDs is transferred to corresponding positions of the driving substrate to form a display panel, in which the LEDs are transferred onto the driving substrate with a transfer process. When the LED is a nano-LED, in an embodiment, the solution containing the nano-LED is dropped on the driving substrate. After the LED is transferred to the driving substrate, voltages are applied to the first electrode 11 and the second electrode 12, so that a potential difference is formed between the first electrode 11 and the second electrode 12. Therefore, an electric field can be formed between the first electrode 11 and the second electrode 12, and the LEDs can self-align under the electric field.

Figure 4:
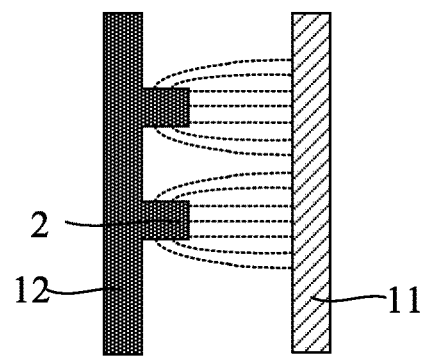
FIG. 4 is a schematic diagram showing electric field lines between the first electrode and the second electrode according to an embodiment of the present disclosure.

In an embodiment of the present disclosure, the convex parts 2 are provided on one of the two electrodes of the driving module 1. The convex parts 2 can be arranged to adjust the electric field arrangement formed after the first electrode 11 and the second electrode 12 are energized. FIG. 4 is a schematic diagram showing electric field lines between the first electrode and the second electrode according to an embodiment of the present disclosure.

In a uniform electric field strength formula U=E*d, U denotes a voltage between two points in the electric field, E denotes an electric field strength between two points in the electric field, and d denotes a distance between two points in the electric field in a field strength direction. It can be learned that an electric field intensity at the convex part 2 is stronger than an electric field intensity at the concave part. When the LEDs are aligned, the convex part 2 can attract the LED to align thereto, that is, the convex part 2 can affect the position of the LED. When the voltage applied to the first electrode 11 is greater than the voltage applied to the second electrode 12, an n-electrode of the LED is aligned with the second electrode 12. Under the influence of the convex part 2, a p-electrode of the LED is aligned with the convex part 2.

Figure 5:
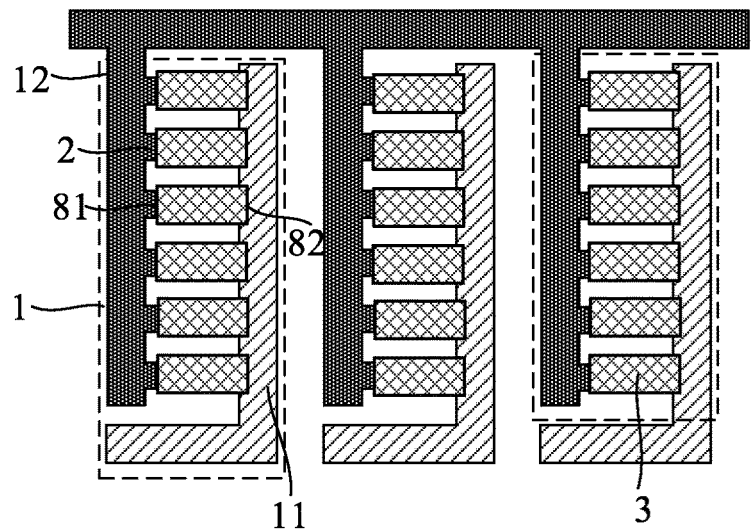
FIG. 5 is a partial schematic diagram showing a display panel according to another embodiment of the present disclosure.

FIG. 5 is a partial schematic diagram showing a display panel according to another embodiment of the present disclosure. FIG. 5 illustrates the corresponding relationship between the LEDs and the driving module 1 of the driving substrate after a plurality of LEDs is transferred to the driving substrate. As shown in FIG. 5, the display panel includes the driving substrate shown in FIG. 3, and a first end 81 of the LED 3 is aligned with the convex part 2, and a second end 82 of the LED 3 is aligned with the first electrode 11. FIG. 5 is a schematic plan view of the display panel. The plan view direction is the same as a direction perpendicular to a plane of the electrodes of the driving module 1. It can be seen from FIG. 5 that the first end 81 of the LED 3 partially overlaps with the convex part 2, and the second end 82 of the LED 3 partially overlaps with the first electrode 11.

In the display panel provided by the present disclosure, a plurality of LEDs 3 corresponding to one driving module 1 forms one pixel. As shown in FIG. 5, one driving module 1 corresponds to six LEDs 3. The plurality of LEDs 3 corresponding to one driving module 1 has a same light color.

With the design of the convex part 2, the electric field arrangement formed after the first electrode 11 and the second electrode 12 are energized can be adjusted. When the LED 3 is transferred to the driving substrate and aligned with the driving module, the convex part 2 can attract one end of LED 3 to aligned with it, so that the position of the LED can be controlled, thereby improving the transfer alignment accuracy of the LED, achieving that the number of LEDs that are aligned with the driving module 1 after the transfer and alignment is the same as the preset number of alignment, and achieving the basically same luminous efficiency of various pixels.

In an embodiment of the present disclosure, a distance between the convex parts 2 of the same electrode is set. The distance between two adjacent convex parts 2 is set to a fixed value, so that it can achieve that the distances between adjacent LEDs are basically the same after binding the LEDs on the driving substrate, thereby improving the uniformity of luminous brightness of the display panel.

In an embodiment of the present disclosure, the shape of the convex part 2 is not limited. As shown in FIG. 3, since the shape of the convex part 2 is roughly rectangular, the distances between two adjacent convex parts 2 are basically the same.

In an embodiment of the present disclosure, if the convex part 2 has a trapezoidal shape, the distances between the two adjacent convex parts 2 are not the same. In an embodiment of the present disclosure, as shown in FIG. 3, a length of an end of the convex part 2 away from the second electrode is a ninth length $l_9$. A minimum distance $d_{mix}$ between two adjacent convex parts 2 is greater than the ninth length $l_9$. That is, the distance between two adjacent convex parts 2 is relatively large. In the present disclosure, when the size of the LED and the distance between the convex part 2 and the first electrode 11 are designed to achieve the transfer and alignment of the LED, even if an LED is located between two adjacent convex parts 2, this LED cannot form a path to contribute to the light-emission of the pixel.

In the following embodiments, the expression "a length of an end of the convex part" refers to a length of an end of the convex part away from the electrode where the convex part is located. In general, the corners of the rectangular shape are right angles. In some embodiments of the present disclosure, the shape of the convex part 2 is a rectangle with rounded corners. For the convex part with a rounded rectangular shape, the length of the end shall be understood in the same way as the length of the end of a rectangle with right angles.

As shown in FIG. 3, the second electrodes 12 of the plurality of driving modules 1 are connected to each other, and the first electrodes 11 of the plurality of driving modules 1 are isolated from each other, that is, the second electrodes 12 are common electrodes.

In another embodiment of the present disclosure, the second electrodes 12 of the plurality of driving modules 1 are connected to each other, and the first electrodes 11 of the plurality of driving modules 1 are isolated from each other. The first electrode 11 includes convex parts. The electrode structure in this embodiment which is not shown can refer to FIG. 3.

Figure 6:
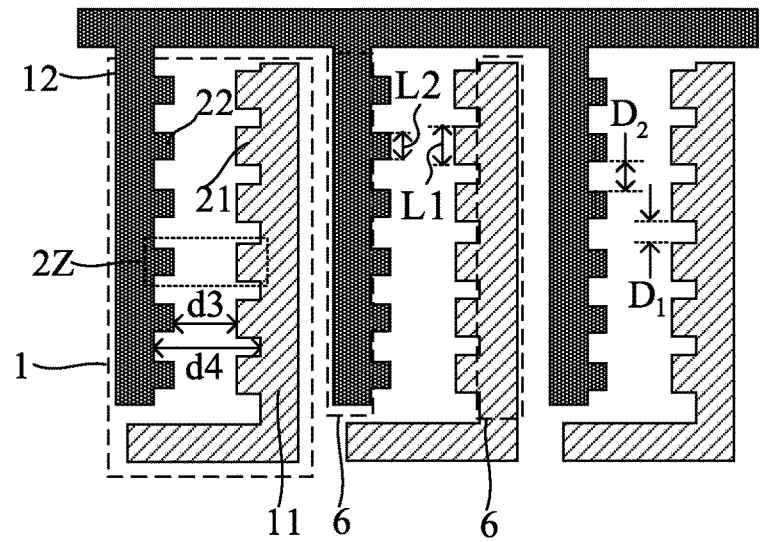
FIG. 6 is a partial schematic diagram showing a driving substrate according to another embodiment of the present disclosure.
Figure 7:
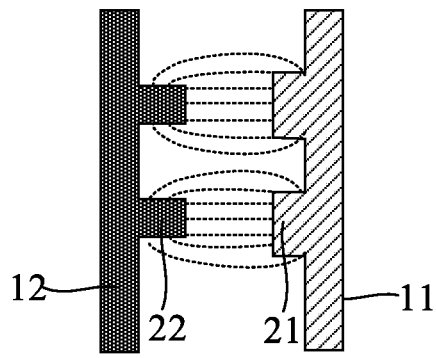
FIG. 7 is a schematic diagram showing electric field lines between the first electrode and the second electrode according to another embodiment of the present disclosure.

FIG. 6 is a partial schematic diagram showing a driving substrate according to another embodiment of the present disclosure, and FIG. 7 is a schematic diagram showing electric field lines between the first electrode and the second electrode according to another embodiment of the present disclosure.

In an embodiment, as shown in FIG. 6, a driving module 1 includes a first electrode 11 and a second electrode 12, each of which includes convex parts. The convex part protrudes from one electrode where the convex part is located towards the other electrode. FIG. 6 schematically shows that the first electrode 11 includes first convex parts 21, and the second electrode 12 includes second convex parts 22. The first convex part 21 and the second convex part 22 that are opposite to each other form a convex part group 2Z. A concave part is formed by a part of the first electrode 11 between two adjacent first convex parts 21, and a concave part is also formed by a part of the second electrode 12 between two adjacent second convex parts 22. The concave part of the first electrode 11 is opposite to the concave part of the second electrode 12. It can be seen that a distance d3 between the first convex part 21 and the second convex part 22 that are opposing to each other is smaller than a distance d4 between two concave parts opposing to each other. After applying voltages to the first electrode 11 and the second electrode 12, respectively, an electric field intensity at the first convex part 21 is greater than an electric field intensity at the concave part of the electrode where it is located, and an electric field intensity at the second convex part 22 is greater than the electric field intensity at the concave part of the electrode where it is located. When the LEDs are transferred to the driving substrate for alignment, the first convex part 21 and the second convex part 22 can affect the positions of the LED.

Figure 8:
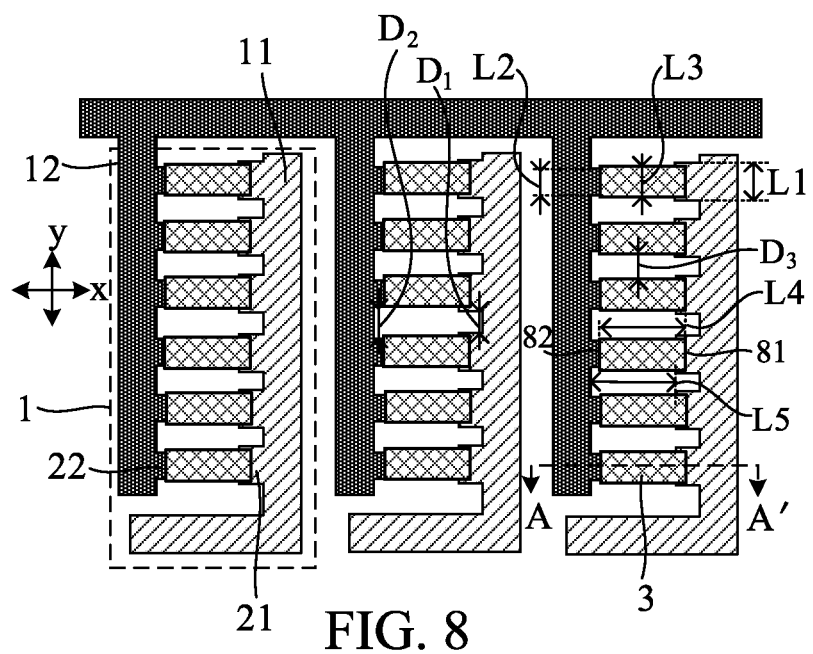
FIG. 8 is a partial schematic diagram showing a display panel according to another embodiment of the present disclosure.

FIG. 8 is a partial schematic diagram showing a display panel according to another embodiment of the present disclosure. FIG. 8 is a plan view of the display panel and illustrates a corresponding relationship between the LEDs and the driving module 1 of the driving substrate. The display panel includes the driving substrate shown in FIG. 6. As shown in FIG. 8, in a direction perpendicular to the plane of one of the two electrodes, the first end 81 of the LED 3 partially overlaps with the first convex part 21, and the second end 82 of the LED 3 partially overlaps with the second convex part 22.

When the LED 3 is transferred to the driving substrate and aligned, voltages are applied to the first electrode 11 and the second electrode 12, respectively, to form an electric field. Under the electric field, the first convex part 21 can attract one end of the LED 3 to align with the first convex part 21, and the second convex part 22 can attract the other end of the LED 3 to align with the second convex part 22. The first convex part 21 and the second convex part 22 jointly control the positions of the LED, so that the transfer and alignment accuracy of the LED can be improved, thereby achieving that the number of LEDs that align with the driving module 1 after the transfer and alignment is the same as the preset alignment number, and achieving the basically same luminous efficiency of various pixels.

As shown in FIG. 8, a direction from the first end 81 of the LED 3 to the second end 82 of the LED 3 is a first direction x; the LED 3 has a length L4 in the first direction x; for the driving module 1 and the corresponding LED 3: a concave edge is formed by an edge of a part of the electrode between two adjacent second convex parts 22 in the electrode (it can be understood with reference to the position of the concave edge shown in FIG. 3). In the first direction x, a distance between the end of the first convex part 21 close to the second convex part 22 and the concave edge is L5 greater than L4. With such configuration, when the LED is transferred and aligned, even if one end of redundant LED overlaps and aligns with the first convex part 21, since the LED has a limited length in the first direction x, the other end of the LED cannot overlap and align with the concave edge of the second electrode 12, thereby achieving that the number of LEDs aligned with one driving module is the same as the preset alignment number.

In the driving substrate provided by the present disclosure, the driving module includes two electrodes. At least one of the two electrodes includes convex parts protruding from the electrode where it is located towards the other electrode. When the LED is transferred and aligned, voltages are applied to the two electrodes, respectively, to form an electric field. The electric field intensity at the convex part of the electrode is greater than the electric field intensity at the part of the electrode between two adjacent convex parts. The convex part can be designed to adjust arrangement of the electric field, so that the transfer position and the transfer location form of the LED can be affected. That is, the location of the LED can be controlled through the design of the convex part, so that the transfer and alignment accuracy of the LED can be increased, thereby achieving that the number of LEDs aligned with the driving module after the transfer and alignment is the same as the preset alignment number, and achieving basically the same luminous efficiency of various pixels.

Figure 9:
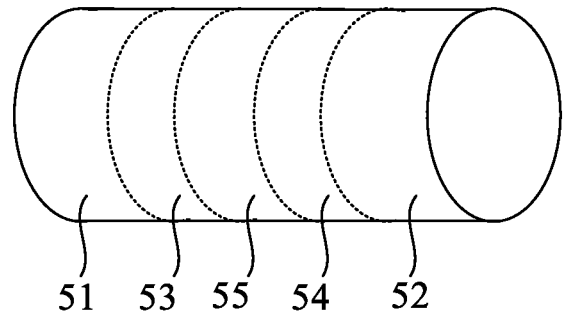
FIG. 9 is a schematic diagram showing an LED of a display panel according to an embodiment of the present disclosure.
Figure 10:
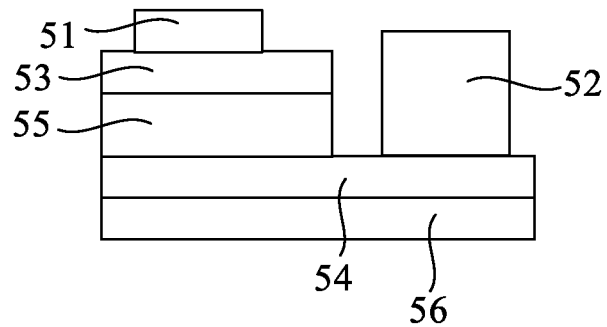
FIG. 10 is a schematic diagram showing an LED of a display panel according to another embodiment of the present disclosure.

FIG. 9 is a schematic diagram showing an LED of a display panel according to an embodiment of the present disclosure, and FIG. 10 is a schematic diagram showing an LED of a display panel according to another embodiment of the present disclosure.

As shown in FIG. 9, the LED has a similar column shape, and at least includes a p-electrode 51, an n-electrode 52, a p-type semiconductor layer 53, an n-type semiconductor layer 54, and an active layer 55. The p-electrode 51 and the n-electrode 52 are located at two ends of the LED, respectively.

As shown in FIG. 10, the LED includes a sapphire substrate 56, an n-type semiconductor layer 54, an active layer 55, a p-type semiconductor layer 53, a p-electrode 51 and an n-electrode 52. The p-electrode 51 and the n-electrode 52 are located at the same side of the LED.

FIG. 9 and FIG. 10 merely illustrate two different structures of the LED in the display panel provided by embodiments of the present disclosure, which are not intended to limit the present disclosure.

In an embodiment of the present disclosure, the two electrodes in the driving module each include a body and convex parts. At least two convex parts respectively belonging to the two electrodes form a convex part group. The convex part group includes a first convex part and m second convex parts, where m is an integer not smaller than 1. The first convex part and the second convex part belong to two electrodes, respectively, and the first convex part is opposite to the m second convex parts. That is, the convex part group includes the first convex part and second convex parts opposite to the first convex part. In an embodiment of the present disclosure, one first convex part is opposite to one second convex part. In another embodiment of the present disclosure, one first convex part is opposite to two or more second convex parts.

It is shown in FIG. 6 that one first convex part 21 is opposite to one second convex part 22. An end of the first convex part 21 close to the second convex part 22 has a length L1, and an end of the second convex part 22 close to the first convex part 21 has a length L2. L1 is greater than L2. That is, the length of the end of the first convex part 21 is different from the length of the end of the second convex part 22.

In the electric field formed by respectively applying voltages to the first electrode 11 and the second electrode 12, the length of the end of the convex part is negatively correlated with the electric field strength at its location, that is, the electric field intensity at the second convex part 22 with a shorter end length is greater than the electric field intensity at the first convex part 21 with a longer end length. Since the end of the first convex part 21 has a longer length, a lateral coverage of the electric field at its location is relatively large.

During the LED transfer and alignment process, the electric field intensity at the second convex part 22 is greater than the electric field intensity at the concave part, so that the second convex part 22 attracts the corresponding end of the LED to align with it. Simultaneously, the electric field intensity at the first convex part 21 is also greater than the electric field intensity at the concave part, and the lateral coverage of the electric field at the first convex part 21 is relatively large. The first convex part and the second convex part respectively with a large end length and a small end length are set to match with each other, which can enhance the ability to capture the LED. When there is a certain range of position deviation between the LED and the convex part, the LED can be attracted back by the electric field to align with the convex part. The ability to capture the LED can be understood as the ability of the convex part to attract the LED to align with the convex part. When the LEDs are aligned, the first convex part 21 with a longer end length can facilitate addressing of the LEDs, and the second convex part 22 with a shorter end length can prevent the plurality of LEDs from locating on the same second convex part 22, which causes a difference between the number of LEDs aligned with the driving module and the preset alignment number.

In application, the length of the end of the first convex part 21 and the length of the end of the second convex part 22 in the driving substrate are designed according to the size of the LED, so that the first convex part 21 and the second convex part 22 can match with each other. Therefore, the transfer and alignment accuracy can be improved during the LED transfer and alignment, thereby achieving that the number of LEDs aligned with the driving module 1 after the transfer and alignment is the same as the preset alignment number, and achieving basically the same luminous efficiency of various pixels.

In a display panel according to an embodiment of the present disclosure, the expected alignment state of the LED is as follows: the first end of the LED partially overlaps with the first convex part 21, and the second end of the LED partially overlaps with the second convex part 22.

As shown in FIG. 6 and FIG. 8, a direction perpendicular to the first direction x is a second direction y. The LED 3 has a width L3 in the second direction y. For the LED 3 and the first convex part 21 and the second convex part 22 that overlap with the LED 3, L1≥L3≥L2. That is, a width of the LED 3 in the second direction y is between the length of the end of the first convex part 21 and the length of the end of the second convex part 22. If the length L3 of the end of the first convex part 21 is set to be greater than the width of the LED 3 in the second direction y, when the LED 3 is aligned with the driving module 1, the addressing of the LED 3 can be facilitated so that the corresponding end of the LED 3 is aligned with the first convex part 21. Simultaneously, if the length of the end of the second convex part 22 is set to be smaller than the width of the LED 3 in the second direction y, it can be prevented that the ends of plurality of LEDs are aligned with the same second convex part 22 to cause a difference between the number of LEDs aligned with the driving module 1 and the preset alignment number. The present disclosure can improve the transfer and alignment accuracy of LED, so that the number of LED aligned with the driving module 1 after the transfer and alignment is the same as the preset alignment number, achieving the basically same luminous efficiency of various pixels.

In an embodiment of the present disclosure, as shown in FIG. 6, the first electrode 11 includes first convex parts 21, and the second electrode 12 includes second convex parts 22. That is, when a driving module 1 includes a plurality of convex part groups 2Z, the first convex parts 21 in each convex part group 2Z belong to a same electrode, and the second convex parts 22 in each convex part group 2Z belong to another same electrode. When designing the size of the electrodes in the driving module, it can combine the size of the LED, the size of the convex part, the distance between two adjacent convex parts, and the number of LEDs corresponding to a single driving module. In an embodiment of FIG. 6, all of the first convex parts 21 belong to a same electrode in the driving module 1, and all of the second convex parts 22 belong to the other electrode in the driving module 1, so that the transfer and alignment accuracy of LED can be improved while simplifying the design of the electrode.

As shown in FIG. 6, the first electrode 11 is an isolated electrode, the second electrode 12 is a common electrode, the first electrode 11 includes first convex parts 21, and the second electrode 12 includes second convex parts 22. In another embodiment, the first electrode 11 includes first convex parts 21, the second electrode 12 includes second convex parts 22, the first electrode 11 is a common electrode, and the second electrode 12 is an isolated electrode.

Referring to FIG. 6, a minimum distance between two adjacent first convex parts 21 of the first electrode 11 is a first distance $D_1$, a minimum distance between two adjacent second convex parts 22 of the second electrode 12 is a second distance $D_2$, and the second distance $D_2$ is greater than the first distance $D_1$. In the driving module 1, the distance between two adjacent first convex parts 21 is relatively large, the distance between two adjacent second convex parts 22 is relatively small, and the length L1 of the end of the first convex parts 21 is greater than the length L2 of the end of the second convex part 22, so that the second convex part 22 can be opposite to the first convex part 21. The second convex part 22 and the first convex part 21 match with each other to control the transfer position of the LED.

In the display panel as shown in FIG. 6 and FIG. 8, a distance between two adjacent LEDs 3 corresponding to the driving module 1 is a third distance $D_3$. For the driving module 1 and the corresponding LEDs 3, the second distance $D_2$≥the third distance $D_3$≥the first distance $D_1$, and the first distance $D_1$ is not equal to the second distance $D_2$. With such configuration, the precise alignment of the LEDs 3 and the driving module 1 is achieved, and each second convex part 22 corresponds to only one LED 3. For the convex part group 2Z formed by the first convex part 21 and the second convex part 22, one convex part group 2Z corresponds to one LED 3.

Figure 11:
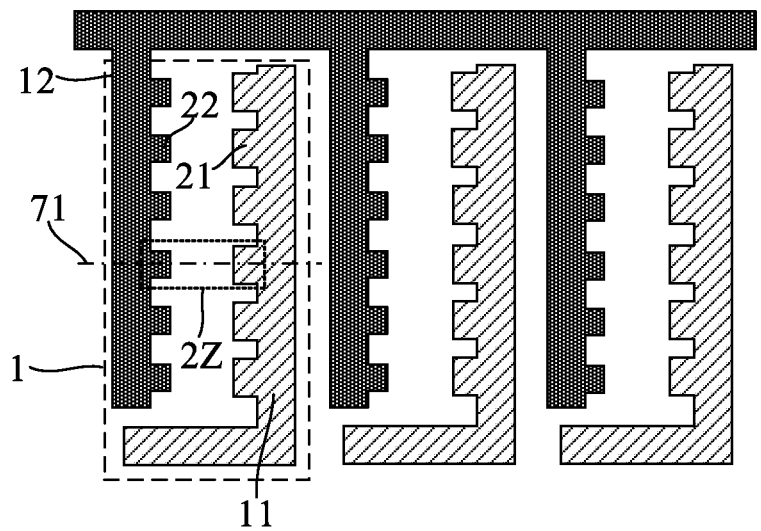
FIG. 11 is a partial schematic diagram showing a driving substrate according to another embodiment of the present disclosure.

FIG. 11 is a partial schematic diagram showing a driving substrate according to another embodiment of the present disclosure. In an embodiment of the present disclosure, as shown in FIG. 11, for one convex part group 2Z: the convex part group 2Z has a first symmetry axis 71, the convex part 21 is symmetrical about the first symmetry axis 71, and the second convex part 22 is symmetrical about the first symmetry axis 71. It can be understood that, in an embodiment in which one driving module 1 includes a plurality of convex part groups 2Z, each of the plurality of convex part groups 2Z corresponds to one first symmetry axis 71. With such configuration, the regularity of the LED arrangement can be achieved after the LEDs are aligned with the driving module 1. The LED corresponding to one driving module 1 is used as a display pixel to achieve the regularity of the LED arrangement, thereby controlling the shape of the light-emitting area of the pixel and improving the uniformity of the luminous efficiency of various pixels.

It should be understood that the first convex part and the second convex part are distinguished by the length of the end of the convex part facing away from the electrode where the convex part is located, but not distinguished by the electrode where the convex parts are located. In two opposite convex parts in one convex part group, the one with the longer end length can be the first convex part, and the other with the shorter end length can be the second convex part.

In an embodiment of the present disclosure, the first electrode includes first convex parts and second convex parts, and the second electrode also includes first convex parts and second convex parts. The convex parts and the second convex parts in the first electrode and the second electrode that are opposite to each other constitute a convex part group.

Figure 12:
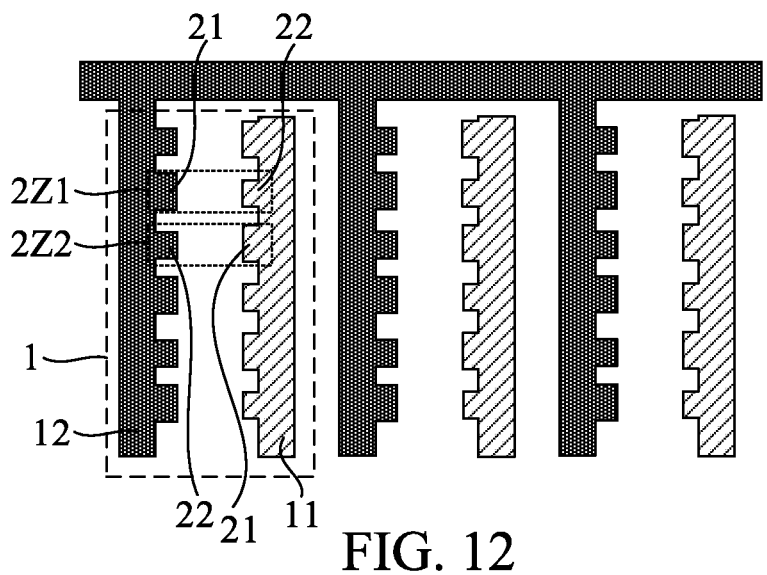
FIG. 12 is a partial schematic diagram showing a driving substrate according to another embodiment of the present disclosure.
Figure 13:
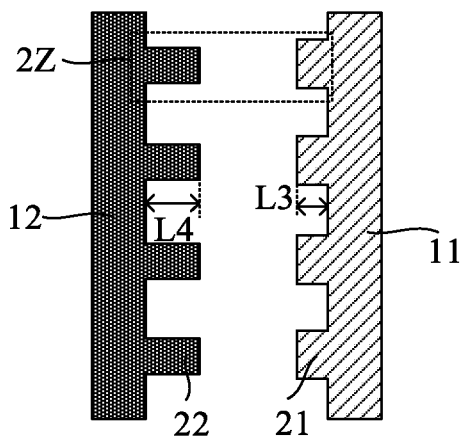
FIG. 13 is a partial schematic diagram showing a driving substrate according to another embodiment of the present disclosure.

FIG. 12 is a partial schematic diagram showing a driving substrate according to another embodiment of the present disclosure, and FIG. 13 is a partial schematic diagram showing a driving substrate according to another embodiment of the present disclosure. As shown in FIG. 12, the convex part groups 2Z in the driving module 1 include a first convex part group 2Z1 and a second convex part group 2Z2. The first convex part 21 of the first convex part group 2Z1 and the second convex part 22 of the second convex part group 2Z2 belong to the first electrode 11. The second convex part 22 of the first convex part group 2Z1 and the first convex part 21 of the second convex part group 2Z2 belong to the second electrode 12. With such configuration, when the number of LEDs corresponding to a single driving module 1 is constant, the length of the convex part group occupied in the arrangement direction can be reduced, so that the size of the module driving module 1 can be reduced, thereby increasing the number of the driving modules 1 in the case of a fixed size of the driving substrate.

In an embodiment of the present disclosure, as shown in FIG. 12, the first convex part groups 2Z1 and the second convex part groups 2Z2 are alternately arranged in the driving module 1. That is, the first convex parts 21 with longer end lengths and the second convex parts 22 with shorter end lengths are alternately arranged in the electrode of the driving module 1. With such configuration, in case of a constant number of LEDs corresponding to a single driving module 1, the length of the convex part group in the arrangement direction can be reduced, so that the size of the driving module 1 can be reduced. In the case of a fixed size of the driving substrate, the number of the driving module 1 can be increased. When assembling into a display panel, one driving module drives one pixel, and the increasing number of driving modules 1 can increase the number of pixels correspondingly, thereby increasing the display resolution.

FIG. 13 is a partial schematic diagram showing a driving substrate according to another embodiment of the present disclosure. In an embodiment of the present disclosure, FIG. 13 shows one driving module 1 on the driving substrate. As shown in FIG. 13, in the convex part group 2Z, the length L3 of the first convex part 21 in its protruding direction is different from the length L4 of the second convex part 22 in its protruding direction.

It should be understood that the length of the convex part in its protruding direction is the protruding length of the convex part. The protruding direction of the convex part is a direction protruding from the electrode where the convex part is located towards the other electrode. The length L3 of the first convex part 21 in the protruding direction is the protruding length of the first convex part 21, and the length L4 of the second convex part 22 in the protruding direction is the protruding length of the second convex part 22. It is shown in FIG. 13 that L3 is smaller than L4. In an embodiment of the present disclosure, the length of the first convex part 21 in its protruding direction is greater than the length of the second convex part 22 in its protruding direction.

In an embodiment of the present disclosure, the first convex part 21 and the second convex part 22 that are opposite to each other in the convex part group 2Z are used to jointly control the positions of the LEDs when the LEDs are aligned. When the LED is transferred and aligned, under the electric field formed between the first electrode 11 and the second electrode 12, the transfer position of the LED is controlled by the electric field in the p-n junction inside the LED. That is, the position of the p-n junction inside the LED affects the transfer position of the LED. For LEDs with different sizes or LEDs with different light colors, the positions of the p-n junctions in these LEDs can be different. Moreover, the length of the two opposite convex parts (that is, the first convex part and the second convex part that are opposite to each other) is positively correlated with the electric field intensity formed between two convex parts. In the present disclosure, the length of the convex parts of the electrode in the driving module 1 can be designed according to the basic parameters of the LED (including the position of the p-n junction in the LED), and the protruding length of the first convex part 21 is different from the protruding length of the second convex part 22 to match with the specific LED, thereby further improving the transfer and alignment accuracy of the LED.

In some embodiments of the present disclosure, the LED shown in FIG. 9 is taken as an example with reference to FIG. 13. For example, when the LEDs are aligned, under the electric field, the first convex part 21 attracts the p-electrode 51 of the LED to align with the first convex part 21, and the second convex part 22 attracts the n-electrode 52 of the LED to align with the second convex part 22. When the position of the p-n junction in the LED that is transferred and aligned is closer to the p-electrode 51, that is, when the distance between the p-n junction position in the LED and the p-electrode 51 is smaller than the distance between the p-n junction position in the LED and the n-electrode 52, the protruding length of the convex part in the driving module can be designed to a larger protruding length of the first convex part 21, so that the electrode structure is matched with the LED to be transferred and aligned, thereby improving the transfer accuracy of the LED.

When the driving substrate provided by the present disclosure is assembled into a display panel, one driving module is aligned opposing to at least one LED, and one driving module is configured to drive one pixel, that is, one pixel includes at least one LED. In an embodiment of the present disclosure, the first convex parts in different driving modules have different lengths, and the different driving modules are configured to drive LEDs with different colors, respectively.

Figure 14:
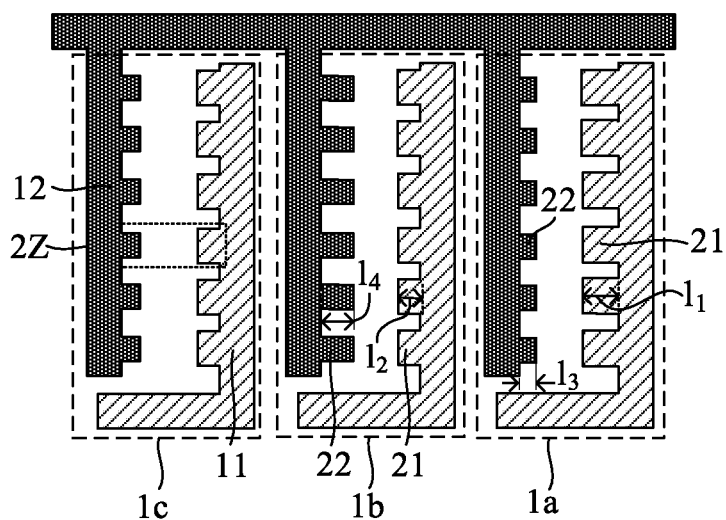
FIG. 14 is a partial schematic diagram showing a driving substrate according to another embodiment of the present disclosure.

FIG. 14 is a partial schematic diagram showing a driving substrate according to another embodiment of the present disclosure. As shown in FIG. 14, a plurality of driving modules includes a first driving module 1a and a second driving module 1b. The length of the convex part 21 of the first driving module 1a in the protruding direction is a first length $l_1$, and the length of the first convex part 21 of the second driving module 1b in the protruding direction is a second length $l_2$, in which the first length $l_1$ is different from the second length $l_2$. It is shown in FIG. 14 that the first length $l_1$ is greater than the second length $l_2$. In application, the first driving module 1a and the second driving module 1b are respectively aligned with and bonded to two LEDs with different light colors. FIG. 14 also shows a third driving module 1c. In an embodiment, the length of the first convex part 21 of the third driving module 1c in its protruding direction is different from the first length $l_1$ and the second length $l_2$.

The basic parameters of LEDs with different light colors are different. In the driving substrate provided by the present disclosure, a differential design on the protruding length of the first convex part in different driving modules is performed to match the LEDs with different light colors, which can improve the transfer accuracy of the LED.

Figure 15:
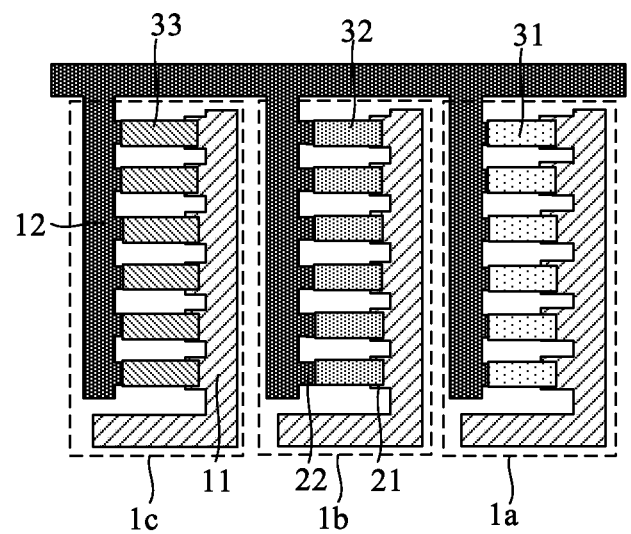
FIG. 15 is a partial schematic diagram showing a display panel according to another embodiment of the present disclosure.

FIG. 15 is a partial schematic diagram showing a display panel according to another embodiment of the present disclosure. In an embodiment, the display panel provided in FIG. 15 includes the driving substrate provided in FIG. 14. As shown in FIG. 15, the first driving module 1a corresponds to the first-color LED 31, the second driving module 1b corresponds to the second-color LED 32, the first driving module 1c corresponds to the third-color LED 33. The colors of light emitting from the first-color LED 31, the second-color LED 32, and the third-color LED 33 are different from each other. The protruding length of the first convex part of the first driving module 1a is different from the protruding length of the first convex part of the second driving module 1b. In an embodiment, the first-color LED 31 emits blue light, the second-color LED 32 emits green light, and the third-color LED 33 emits red light.

As shown in FIG. 14, a length of the second convex part 22 in its protruding direction in the first driving module 1 is a third length $l_3$, and a length of the second convex part 22 in its protruding direction in the second driving module 1 is a fourth length $l_4$. The third length $l_3$ is different from the fourth length $l_4$. FIG. 14 schematically shows that the third length $l_3$ is smaller than the fourth length $l_4$. In the present disclosure, the driving module for driving LEDs with different light colors is designed differently, and the protruding length of the first convex part and/or the protruding length of the second convex part are adjusted to adjust the electric field intensity formed between the first convex part and the second convex part, so that the driving module can be matched with the LED, improving the transfer accuracy of the LED.

In another embodiment, the first length $l_1$ is different from the second length $l_2$, and the third length $l_3$ is the same as the fourth length $l_4$. In another embodiment, the first length $l_1$ is the same as the second length $l_2$, and the third length $l_3$ is different from the fourth length $l_4$.

Figure 16:
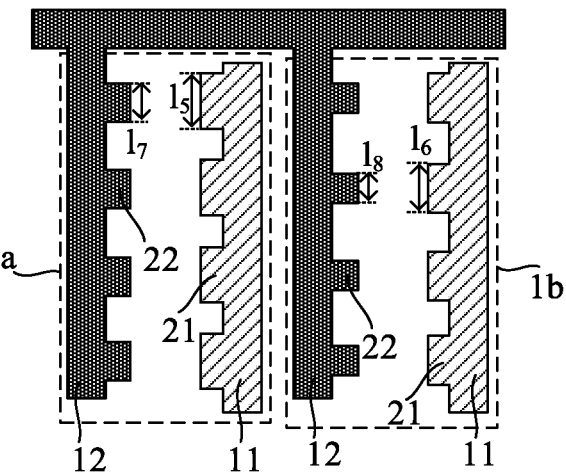
FIG. 16 is a partial schematic diagram showing a driving substrate according to another embodiment of the present disclosure.

FIG. 16 is a partial schematic diagram showing a driving substrate according to another embodiment of the present disclosure. In an embodiment, as shown in FIG. 16, a driving module includes a first driving module 1a and a second driving module 1b. The length of the end of the first convex part 21 close to the second convex part 22 in the first driving module 1a is a fifth length $l_5$, and the length of the end of the first convex part 21 close to the second convex part 22 in the second driving module 1b is a sixth length $l_6$. The fifth length $l_5$ is different from the sixth length $l_6$. According to the relevant description of the embodiment of FIG. 6, when the LED is transferred and aligned, voltages are applied to the first electrode 11 and the second electrode 12, respectively, to form an electric field. The longer the end length of the convex part of the electrode is, the greater the lateral coverage of the electric field at the convex part will be, and the stronger the ability of the convex part to capture the LED will be. In application, the first driving module 1a and the second driving module 1b are aligned with and bonded to two LEDs with different light colors, respectively. For LEDs with different light colors, there can be differences in their sizes or other basic parameters. In an embodiment of the present disclosure, the length of the end of the first convex part 21 of the first driving module 1a is different from the length of the end of the first convex part 21 of the second driving module 1b, so that the first convex parts 21 respectively located in two driving modules have different abilities to capture LEDs, and the end length of the first convex part 21 of the driving module is designed to match the LED that is aligned with the driving module. That is, the electrode of the driving module that is aligned with the LED can be designed according to the size of the LED or other basic parameters, improving the transfer and alignment accuracy of the LED.

Referring to FIG. 16, a length of the end of the second convex part 22 of the first driving module 1 close to the first convex part 21 is a seventh length $l_7$, and a length of the end of the second convex part 22 of the second driving module 1 close to the first convex part 21 is an eighth length $l_8$. The seventh length $l_7$ is different from the eighth length $l_8$. That is, the ability of the second convex part 22 of the first driving module 1a to capture LEDs is different from the ability of the second convex part 22 of the second driving module 1b to capture LEDs. The lengths of the ends of the second convex parts 22 of different driving modules can be different. When the LEDs are transferred and aligned, the second convex parts 22 and the first convex parts 21 match with each other to control the location of the LED. In the present disclosure, the electrodes of the driving module that is aligned with the LED can be designed according to the sizes or other basic parameters of the LED, improving the transfer and alignment accuracy of the LED.

FIG. 16 only schematically shows that the fifth length $l_5$ is greater than the sixth length $l_6$, and the seventh length $l_7$ is greater than the eighth length $l_8$. In an embodiment of the present disclosure, the fifth length $l_5$ is different from the sixth length $l_6$, and the seventh length $l_7$ and the eighth length $l_8$ are the same. In an embodiment of the present disclosure, the fifth length $l_5$ is the same as the sixth length $l_6$, and the seventh length $l_7$ is different from the eighth length $l_8$.

In an embodiment of the present disclosure, when the LEDs are transferred and aligned, the first driving module 1a and the second driving module 1b are aligned with LEDs with different light colors, respectively. That is, the first driving module 1a and the second driving module 1b in the display panel are configured to drive LEDs with different light colors, respectively. In an embodiment, the first driving module 1a and the second driving module 1b are configured to drive a red light-emitting LED and a green light-emitting LED, respectively. In another embodiment, the first driving module 1a and the second driving module 1b are configured to drive the red light-emitting LED and the blue light-emitting LED, respectively. In another embodiment, the first driving module 1a and the second driving module 1b are configured to drive the blue light-emitting LED and the green light-emitting LED, respectively.

Figure 17:
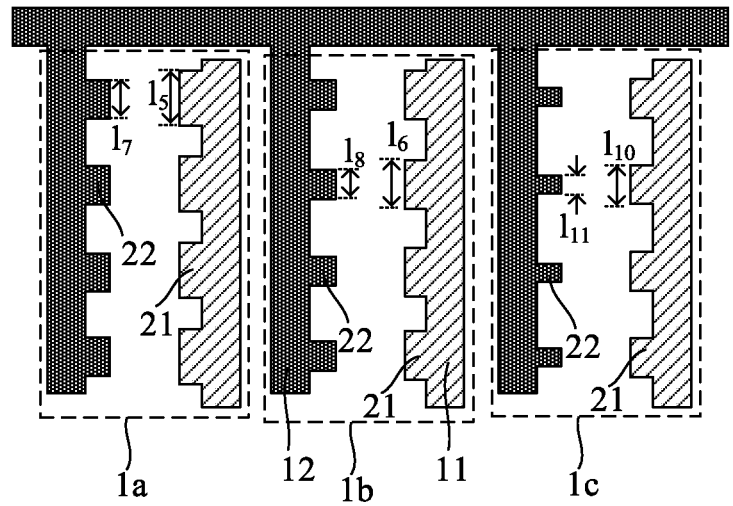
FIG. 17 is a partial schematic diagram showing a driving substrate according to another embodiment of the present disclosure.

FIG. 17 is a partial schematic diagram showing a driving substrate according to another embodiment of the present disclosure. As shown in FIG. 17, the driving module includes a first driving module 1a, a second driving module 1b and a third driving module 1c. In the third driving module 1c, the end of the first convex part 21 has a tenth length $l_{10}$, and the end of the second convex part 22 has an eleventh length $l_{11}$. The tenth length $l_{10}$ is different from the fifth length $l_5$ and the sixth length $l_6$, and the eleventh length $l_{11}$ is different from the seventh length $l_7$ and the eighth length $l_8$. When the LEDs are transferred and aligned, the colors of light emitting from the LEDs that are aligned with and bonded to the first driving module 1a, the second driving module 1b and the third driving module 1c are different from each other.

Figure 18:
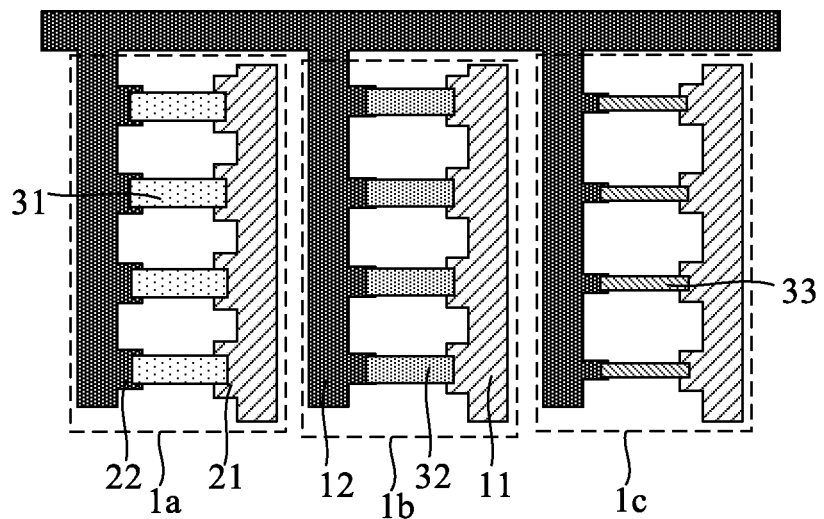
FIG. 18 is a partial schematic diagram showing a display panel according to another embodiment of the present disclosure.

FIG. 18 is a partial schematic diagram showing a display panel according to another embodiment of the present disclosure. The display panel provided in FIG. 18 includes the driving substrate provided in FIG. 17. As shown in FIG. 18, the first driving module 1a corresponds to the first-color LED 31, the second driving module 1b corresponds to the second-color LED 32, and the first driving module 1c corresponds to the third-color LED 33. The light emission colors of the first-color LED 31, the second-color LED 32 and the third-color LED 33 are different from each other.

In an embodiment, the fifth length $l_5$ is greater than the sixth length $l_6$, the sixth length $l_6$ is greater than the tenth length $l_{10}$, the seventh length $l_7$ is greater than the eighth length $l_8$, and the eighth length $l_8$ is greater than the eleventh length $l_{11}$. The first-color LED 31 corresponding to the first driving module 1a emits red light, the second-color LED 32 corresponding to the second driving module 1b emits green light, and the third-color LED 33 corresponding to the third driving module 1c emits blue light.

In an embodiment of the present disclosure, the electrode of the driving module 1 includes a body and a convex part. Taking the electrode structure illustrated in FIG. 6 as an example, as shown in FIG. 6, each of the first electrode 11 and the second electrode includes a body 6. The body 6 is strip-shaped, and is connected to the convex part. In this embodiment, the body 6 of the electrode is strip-shaped, and the bodies 6 of the two electrodes of the driving module 1 extends in approximately same directions, so that the convex parts are provided in the electrode to control the position of the LED when it is transferred and aligned, and the area occupied by a single driving module 1 can be made as small as possible.

In an embodiment of the present disclosure, the body 6 has a trapezoidal shape.

Figure 19:
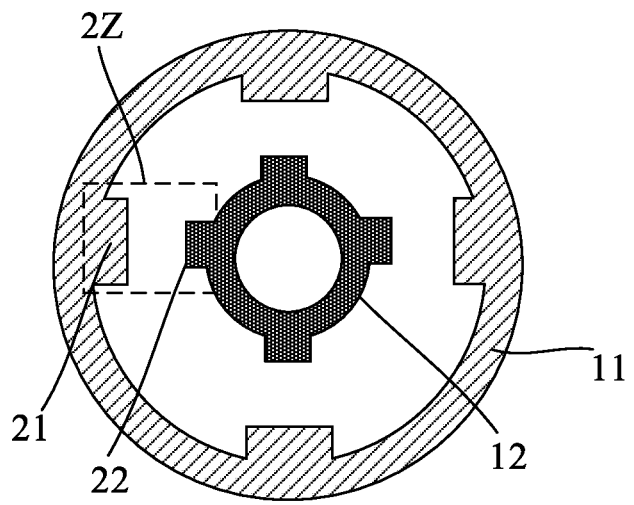
FIG. 19 is a partial schematic diagram showing a driving substrate according to another embodiment of the present disclosure.

FIG. 19 is a partial schematic diagram showing a driving substrate according to another embodiment of the present disclosure. FIG. 19 only illustrates one driving module on the driving substrate. As shown in FIG. 19, the first electrode 11 surrounds the second electrode 12. Each of the first electrode 11 and the second electrode 12 includes convex parts, and the first convex part 21 and the second convex part 22 that are opposite to each other form a convex part group 2Z. In FIG. 19, the first convex parts 21 of the convex part group 2Z belong to the first electrode 11, and the second convex parts 22 belong to the second electrode 12. The first electrode 11 surrounds the second electrode 12, i.e., the first electrode 11 is located at the outer circle of the second electrode 12. When the first electrode 11 and the second electrode 12 are both not provided with convex parts, a circumference of the edge of the first electrode 11 close to the second electrode 12 is relatively long. In combination with the design of the embodiments of the present disclosure, the first electrode 11 and the second electrode 12 are both provided with convex parts, and the convex parts belonging to the two electrodes respectively are opposite to each other. The first convex part 21 with a longer end length is set to belong to the first electrode 11, and the second convex part 22 with a shorter end length is set to belong to the second electrode 12, so that the end length of the first convex part 21 can be adjusted, and the convex parts on the second electrode 12 can be designed, thereby achieving a more reasonable design.

Figure 20:
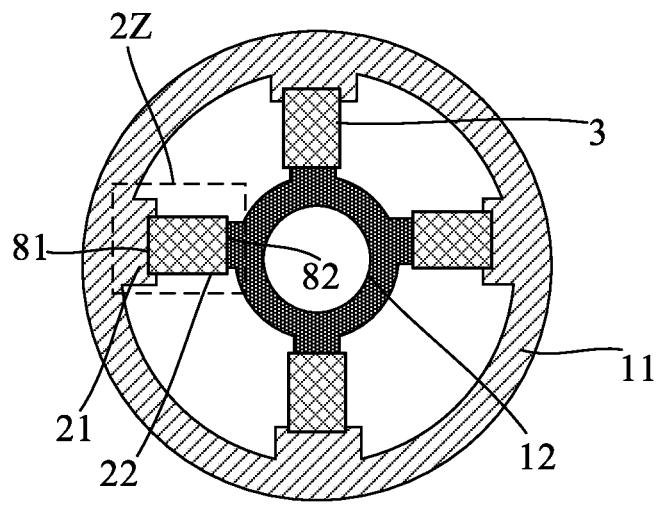
FIG. 20 is a partial schematic diagram showing a display panel according to another embodiment of the present disclosure.

FIG. 20 is a partial schematic diagram showing a display panel according to another embodiment of the present disclosure. The display panel provided in FIG. 20 includes the driving substrate and a plurality of LEDs 3 provided in FIG. 19. FIG. 20 schematically shows a corresponding relationship between one driving module and the LEDs. It can be seen that the first end 81 of the LED 3 partially overlaps with the first convex part 21, and the second end 82 of the LED 3 partially overlaps with the second convex part 22.

In an embodiment of the present disclosure, as shown in FIG. 19, the first electrode 11 surrounds the second electrode 12 to form a closed pattern. The first electrode 11 includes four first convex parts 21, and the second electrode 12 includes four second convex parts 22. After transferring the LEDs to the driving substrate and bonding with the driving module, the driving module illustrated in FIG. 19 corresponds to four LEDs. If the first electrode 11 surrounds the second electrode 12 to form a closed pattern, the four LEDs aligned with the driving module can be driven to emit light simultaneously.

Figure 21:
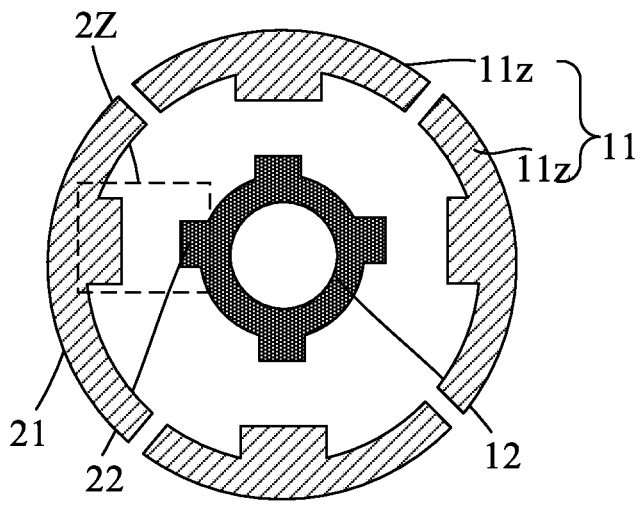
FIG. 21 is a partial schematic diagram showing a driving substrate according to another embodiment of the present disclosure.
Figure 22:
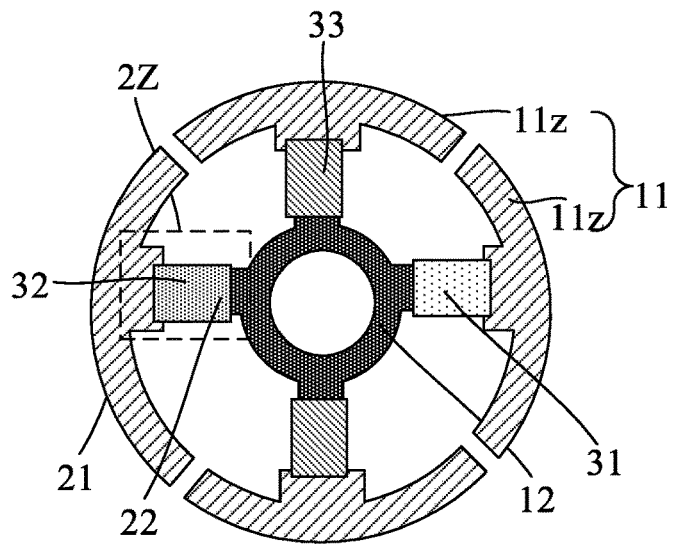
FIG. 22 is a partial schematic diagram showing a display panel according to another embodiment of the present disclosure.

In an embodiment of the present disclosure, the first electrode surrounds the second electrode, the first electrode includes at least two discontinuous first sub-electrodes, and each first sub-electrode includes at least one convex part. FIG. 21 is a partial schematic diagram showing a driving substrate according to another embodiment of the present disclosure. FIG. 22 is a partial schematic diagram showing a display panel according to another embodiment of the present disclosure.

As shown in FIG. 21, the first electrode 11 includes four first sub-electrodes 11z discontinuously arranged in a direction surrounding the second electrode 12. The first sub-electrode 11z includes one first convex part 21. In this embodiment, each first sub-electrode 11z forms a driving sub-module with the second electrode 12. After the LED is transferred to the driving substrate, each driving sub-module corresponds to at least one LED, and each driving sub-module can drive the at least one LED corresponding thereto independently.

In an embodiment, FIG. 22 schematically shows that one driving module includes four driving sub-modules which correspond to four LEDs. One driving sub-module corresponds to the first-color LED 31, another driving sub-module corresponds to the second-color LED 32, and the remaining two driving sub-modules correspond to the third-color LED 33. One driving module corresponds to LEDs respectively emitting light of three different colors, and the first sub-electrodes 11z are disconnected to each other, so that the LEDs respectively emitting light of three different colors can be driven separately.

FIG. 19 and FIG. 21 schematically show that the body of each of the first electrode 11 and the second electrode 12 has a basically circular ring shape. In an embodiment of the present disclosure, the body of each of the first electrode 11 and the second electrode 12 can also have a rectangle or polygonal ring shape.

Figure 23:
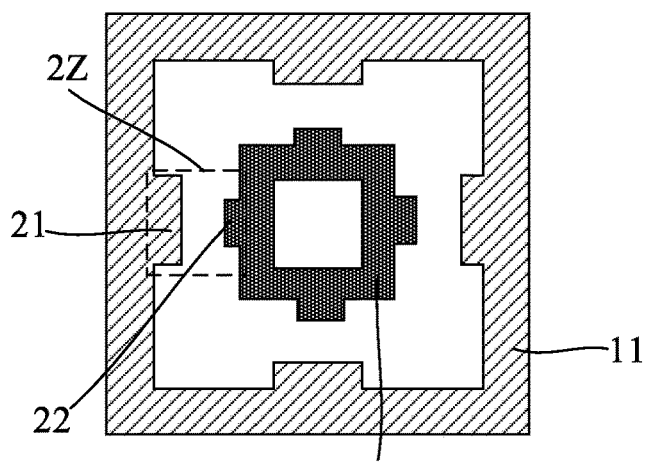
FIG. 23 is a partial schematic diagram showing a driving substrate according to another embodiment of the present disclosure.

FIG. 23 is a partial schematic diagram showing a driving substrate according to another embodiment of the present disclosure. In an embodiment, as shown in FIG. 23, each of the first electrode 11 and the second electrode 12 includes a body and a convex part. The electrode 11 includes a first convex part 21, and the second electrode 12 includes a second convex part 22. The bodies of the two electrodes have a rectangular ring shape.

Figure 24:
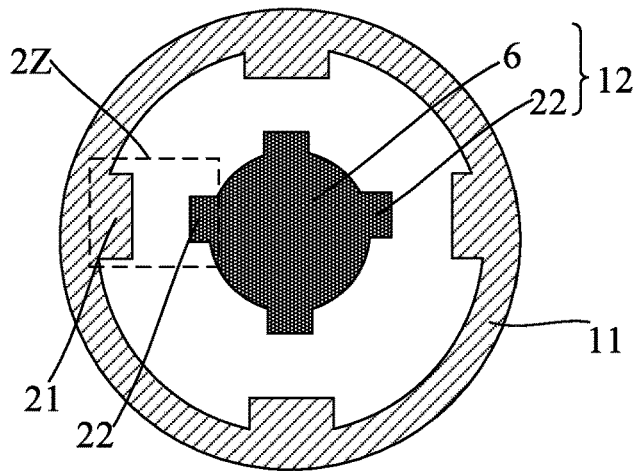
FIG. 24 is a partial schematic diagram showing a driving substrate according to another embodiment of the present disclosure.

FIG. 19 schematically shows that the body of the second electrode 12 has a roughly ring shape. That is, the second electrode 12 is hollow inside. FIG. 24 is a partial schematic diagram showing a driving substrate according to another embodiment of the present disclosure. FIG. 24 schematically shows that one driving module on the driving substrate. As shown in FIG. 24, the body 6 of the second electrode 12 6 is basically round, and is not hollow inside.

Figure 25:
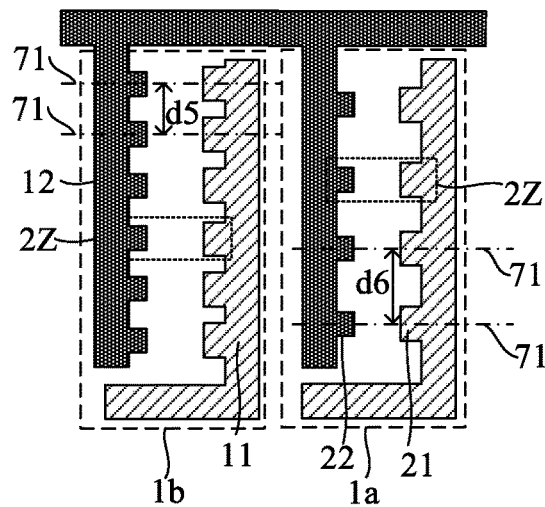
FIG. 25 is a partial schematic diagram showing a driving substrate according to another embodiment of the present disclosure.

FIG. 25 is a partial schematic diagram showing a driving substrate according to another embodiment of the present disclosure. As shown in FIG. 25, a driving module includes a first driving module 1a and a second driving module 1b. The density of the convex part groups 2Z of the first driving module 1a is greater than the density of the convex part groups 2Z of the second driving module 1b. That is, within a same unit area, the number of convex part groups 2Z of the first driving module 1a is greater than the number of convex part groups 2Z of the second driving module 1b. FIG. 25 schematically shows that one convex part group 2Z includes one first convex part 21 and one second convex part 22.

With reference to the related description about the first symmetry axis 71 shown in FIG. 11, it can be learned that each convex part group 2Z has one first symmetry axis 71 correspondingly. As shown in FIG. 25, a distance between two adjacent first symmetry axes 71 in the first driving module 1a is d5, and a distance between two adjacent first symmetry axes 71 in the second driving module 1b is g6, where d5 is smaller than d6.

In an embodiment of the present disclosure, the LEDs with different light colors have different luminous efficiencies, so that the driving modules of the driving substrate can be set to include different numbers of convex part groups to match the luminous efficiency of the LEDs. For example, for LEDs with higher luminous efficiency, the number of convex part group 2Z of the driving module corresponding to the LED is smaller. For LEDs with lower luminous efficiency, the number of convex part group 2Z of the driving module corresponding to the LED is larger. With such configuration, the luminous efficiency of the pixels of different colors in the display panel can be basically the same.

Figure 26:
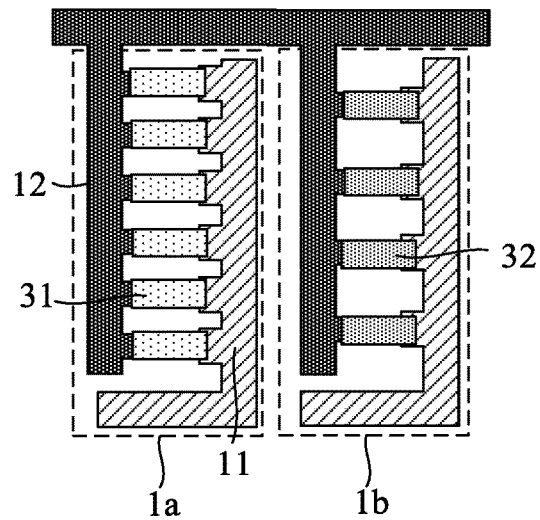
FIG. 26 is a schematic diagram showing a display panel according to another embodiment of the present disclosure.

FIG. 26 is a schematic diagram showing a display panel according to another embodiment of the present disclosure. The display panel provided in FIG. 26 includes the driving substrate provided in FIG. 25. As shown in FIG. 26, in the display panel, a first driving module 1a corresponds to six first-color LEDs 31, and a second driving module 1b corresponds to four second-color LEDs 32. A plurality of first-color LEDs 31 corresponding to the first driving module 1a forms a first-color pixel, and a plurality of second-color LEDs 32 corresponding to the second driving module 1b forms a second-color pixel. When the luminous efficiency of a single first-color LED 31 is smaller than the luminous efficiency of a single second-color LED 32, the first-color LED 31 corresponds to the first driving module 1a, and the second-color LED 32 corresponds to the second driving module 1b, so that the luminous efficiency of the two color pixels can be balanced by increasing the number of the first-color LED 31 in the pixels formed by the first-color LEDs 31, thereby achieving the basically same luminous efficiency of various pixels with different colors.

Figure 27:
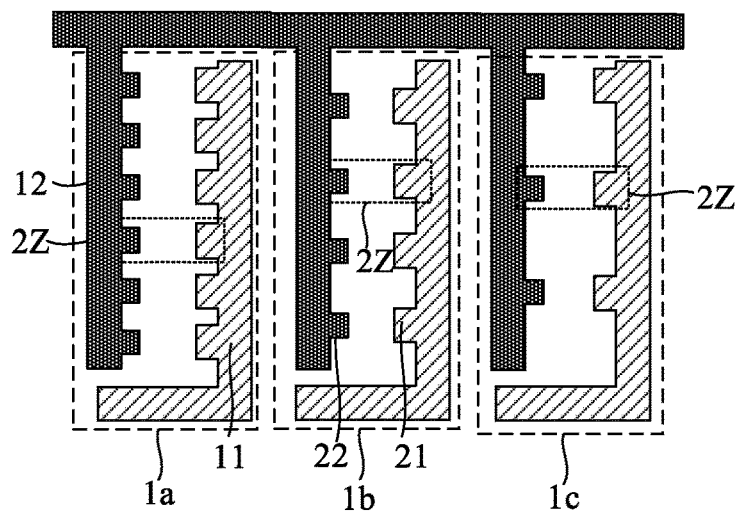
FIG. 27 is a partial schematic diagram showing a driving substrate according to another embodiment of the present disclosure.

FIG. 27 is a partial schematic diagram showing a driving substrate according to another embodiment of the present disclosure. As shown in FIG. 27, the plurality of driving modules 1 can further include a third driving module 1c. The density of the convex part groups 2Z of the second driving module 1b is greater than the density of the convex part groups 2Z of the third driving module 1b. That is, the driving substrate includes three types of driving modules. The densities of the convex part groups of these three driving modules are different from each other. In application, the three driving modules can match three LEDs with three different luminous efficiency to achieve the basically same luminous efficiency of various pixels in the display panel.

Figure 28:
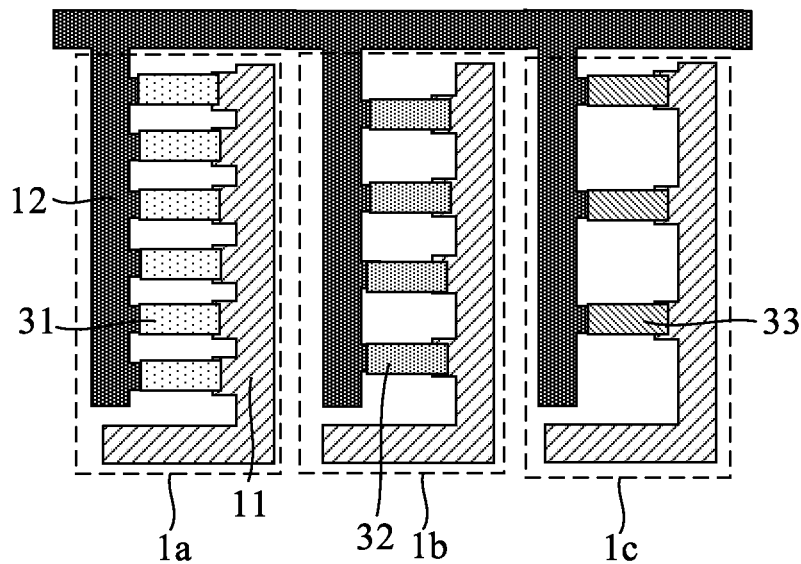
FIG. 28 is a schematic diagram showing a display panel according to another embodiment of the present disclosure.

FIG. 28 is a schematic diagram showing a display panel according to another embodiment of the present disclosure. The display panel provided in FIG. 28 includes the driving substrate provided in FIG. 27. As shown in FIG. 28, the first driving module 1a corresponds to the first-color LED 31, the second driving module 1b corresponds to the second-color LED 32, and the first driving module 1c corresponds to the third-color LED 33. Each of the first-color LED 31, the second-color LED 32 and the third-color LED 33 emits one of red light, green light, and blue light. The luminous efficiency of a single first-color LED 31 is smaller than the luminous efficiency of a single second-color LED 32, and the luminous efficiency of a single second-color LED 32 is smaller than the luminous efficiency of a single third-color LED 33. In an embodiment, the first-color LED 31 emits red light, the second-color LED 32 emits blue light, and the third-color LED 33 emits green light. LEDs with lower luminous efficiency corresponds to the driving module with higher density of convex parts, so that the difference in luminous efficiency of the LEDs can be balanced by increasing the number of LEDs of the pixels, thereby achieving the basically same luminous efficiency of various pixels in the display panel.

Figure 29:
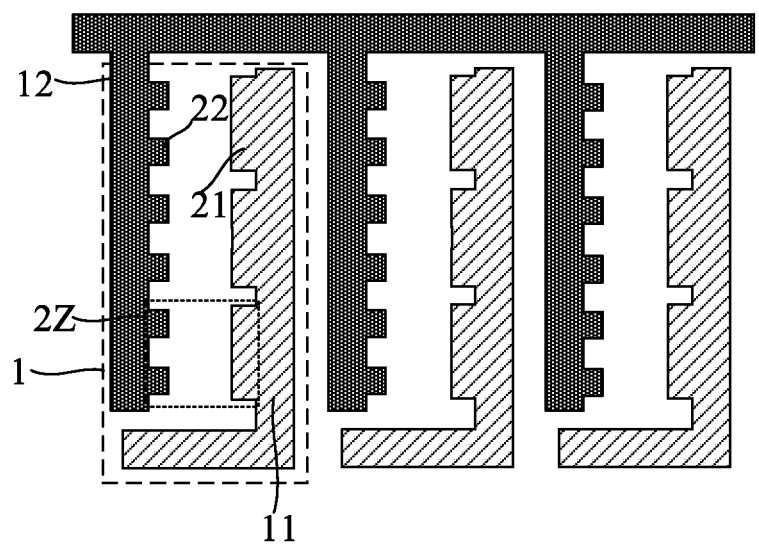
FIG. 29 is a schematic diagram showing a driving substrate according to another embodiment of the present disclosure.

The foregoing embodiments all illustrate that one first convex part corresponds to one second convex part. In an embodiment of the present disclosure, one first convex part corresponds to two or more second convex parts. FIG. 29 is a schematic diagram showing a driving substrate according to another embodiment of the present disclosure. As shown in FIG. 29, the first convex part 21 and the two second convex parts 22 that are opposite to the first convex part 21 form a convex part group 2Z. When the LED is transferred and aligned, a voltage is applied to the first electrode 11 and the second electrode 12 respectively to form an electric field. Under the action of the electric field, the LED moves to align. Since the end of the first convex part 21 has a longer length, it can be used for attracting LED to addressing and aligning. Since the end of the second convex part 22 has a short length, it can be prevented that a plurality of LEDs is arranged on a same second convex part 22, that is, the second convex part 22 can attract one LED to align with the second convex part 22, so that the transfer and alignment accuracy of the LED can be improved.

Figure 30:
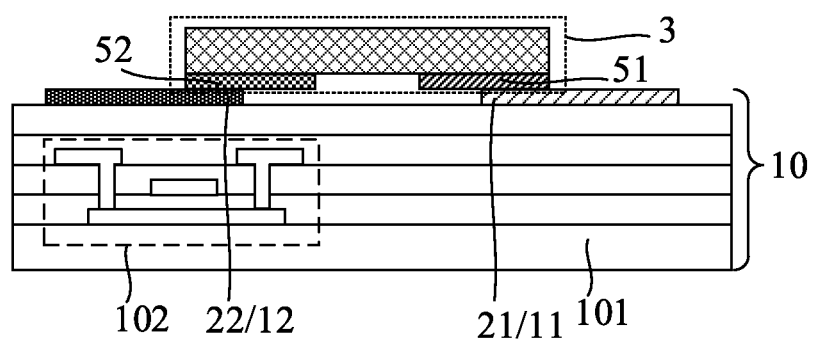
FIG. 30 is a cross-sectional view along line A-A' shown in FIG. 8 according to an embodiment of the present disclosure.

FIG. 30 is a cross-sectional view along line A-A' shown in FIG. 8 according to an embodiment of the present disclosure. As shown in FIG. 30, a LED 3 includes a p-electrode 51 and an n-electrode 52 that are located at a side of the LED 3 facing towards the driving substrate 10. The p-electrode is in contact with the first convex part 21, and the n-electrode is in contact with the second convex part 22. The driving substrate 10 further includes a base 101 and a drive circuit 102 located on the base 101. FIG. 30 only exemplarily shows one transistor of the drive circuit 102.

In another embodiment, the p-electrode 51 and the n-electrode 52 are located at a side of the LED 3 facing towards the driving substrate 10. The n-electrode is in contact with the first convex part 21, and the p-electrode is in contact with the second convex part 22.

Figure 31:
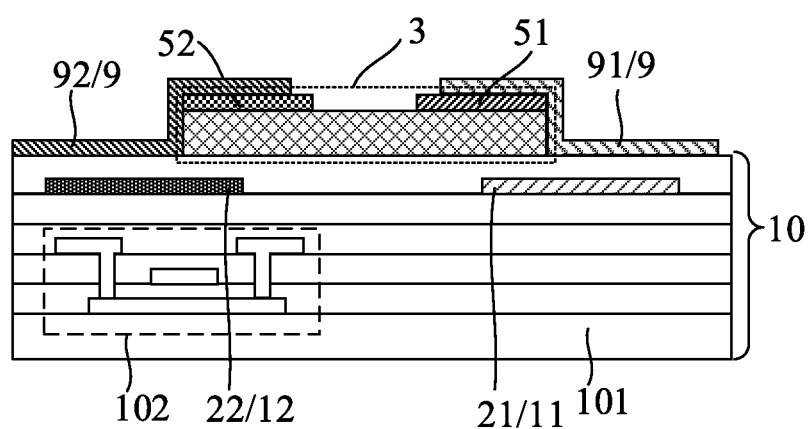
FIG. 31 is a cross-sectional view along line A-A' shown in FIG. 8 according to another embodiment of the present disclosure.

FIG. 31 is a cross-sectional view along line A-A' shown in FIG. 8 according to another embodiment of the present disclosure. As shown in FIG. 31, a LED 3 includes a p-electrode 51 and an n-electrode 52 that are located at a side of the LED 3 facing away from the driving substrate 10. In a direction perpendicular to the plane of the first electrode 11 and the second electrode 12, the p-electrode 51 partially overlaps with the first convex part 21, and the n-electrode 52 partially overlaps with the second convex part 22. The display panel can further include a contact electrode 9 which is located at a side of the LED 3 facing away from the driving substrate 10. The contact electrode 9 includes a first contact electrode 91 and a second contact electrode 92. The first contact electrode 91 is in contact with the p-electrode 51, and the second contact electrode 92 is in contact with the n-electrode 52. In this embodiment, a voltage is applied to the p-electrode 51 through the first contact electrode 91, and a voltage is applied to the n-electrode 52 through the second contact electrode 92, so that the LED 3 is driven to emit light.

In another embodiment, in a direction perpendicular to the plane of the first electrode 11 and the second electrode 12, the n-electrode 52 partially overlaps with the first convex part 21, and the p-electrode 51 partially overlaps with the second convex part 22, which are not shown in the drawings here.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

Finally, the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A driving substrate, comprising:
   driving modules, wherein each of the driving modules comprises two electrodes, wherein each of at least one of the two electrodes comprises convex parts, and each of the convex parts protrudes from one of the two electrodes where the convex parts are located towards the other one of the two electrodes;
   wherein each of the two electrodes comprises a body and the convex parts, and one of the convex parts of one of the two electrodes and one of the convex parts of the other one of the two electrodes form one of convex part groups; and
   wherein each of at least one of the convex part groups comprises one of first convex parts that belongs to one of the two electrodes and m second convex parts of second convex parts that belong to the other one of the two electrodes, and the one of the first convex parts is opposite to the m second convex parts, where m is an integer not smaller than 1; and a length L1 of an end of the one of the first convex parts close to the m second convex parts is greater than a length L2 of an end of one of the m second convex parts close to the one of the first convex parts.

2. The driving substrate according to claim 1, wherein the two electrodes are a first electrode and a second electrode, respectively; and the first electrode comprises the first convex parts, and the second electrode comprises the second convex parts; and
   wherein a minimum distance between two adjacent first convex parts of the first convex parts of the first electrode is a first distance, a minimum distance between two adjacent second convex parts of the second convex parts of the second electrode is a second distance, and the second distance is greater than the first distance.

3. The driving substrate according to claim 1, wherein in one of the convex part groups, the convex part group has a first symmetry axis, the first convex part is symmetric about the first symmetry axis, and one of the m second convex parts is symmetric about the first symmetry axis.

4. The driving substrate according to claim 1, wherein the two electrodes are a first electrode and a second electrode, respectively;
   wherein the convex part groups of the driving module comprise first convex part groups and second convex part groups;
   wherein the one of the first convex parts in one of the first convex part groups and the m second convex parts in one of the second convex part groups belong to the first electrode;
   wherein the m second convex parts in the one of the first convex part groups and the one of the first convex parts in the one of the second convex part groups belong to the second electrode; and;
   wherein the first convex part groups and the second convex part groups of the driving module are alternately arranged.

5. The driving substrate according to claim 1, wherein the driving modules comprise a first driving module and a second driving module,
   wherein a length of one of the first convex parts of the first driving module in a direction where the one of the first convex parts of the first driving module protrudes is a first length, and a length of the one of the first convex parts of the second driving module in a direction where the one of the first convex parts of the second driving module protrudes is a second length different from the first length; and/or
   wherein a length of one of the second convex parts of the first driving module in a direction where the one of the second convex parts of the first driving module protrudes is a third length, and a length of one of the second convex parts of the second driving module in a direction where the one of the second convex parts of the second driving module protrudes is a fourth length different from the third length.

6. The driving substrate according to claim 1, wherein the driving modules comprise a first driving module and a second driving module,
   wherein a length of an end of one of the first convex parts of the first driving module close to the second convex parts of the first driving module is a fifth length, and a length of an end of one of the first convex parts of the second driving module close to the second convex parts of the second driving module is a sixth length different from the fifth length; and/or
   wherein a length of an end of one of the second convex parts of the first driving module close to the first convex parts of the first driving module is a seventh length, and a length of an end of one of the second convex parts of the second driving module close to the first convex parts of the second driving module is an eighth length different from the seventh length.

7. The driving substrate according to claim 1, wherein the two electrodes are a first electrode and a second electrode, respectively; and the first electrode surrounds the second electrode.

8. The driving substrate according to claim 7, wherein the first electrode surrounds the second electrode to form a closed pattern; or
   wherein the first electrode comprises at least two first sub-electrodes spaced apart from one another and arranged in a direction surrounding the second electrode, and one of the at least two first sub-electrodes comprises at least one of the convex parts.

9. The driving substrate according to claim 1, wherein the driving modules comprise a first driving module and a second driving module, and a density of the convex part groups of the first driving module is greater than a density of the convex part groups of the second driving module.

10. The driving substrate according to claim 9, wherein the driving modules further comprise a third driving module, and a density of the convex part groups of the second driving module is greater than a density of the convex part groups of the third driving module.

11. A driving substrate, comprising:
    driving modules, wherein each of the driving modules comprises two electrodes, wherein each of at least one of the two electrodes comprises convex parts, and each of the convex parts protrudes from one of the two electrodes where the convex parts are located towards the other one of the two electrodes; and
    wherein only one electrode of the two electrodes comprises the convex parts, a length of an end of one of the convex parts away from an end of the only one electrode is a ninth length, and a minimum distance between two adjacent convex parts of the convex parts is greater than the ninth length.

12. A display panel, comprising:
a driving substrate according to claim 11; and
light-emitting diodes (LEDs) located at a side of the driving substrate,
wherein one of the LEDs comprises a first end partially overlapping with one of the convex parts in one of the two electrodes in a direction perpendicular to a plane of one of the two electrodes, and a second end partially overlapping with the other one of the two electrodes in the direction perpendicular to the plane of the one of the two electrodes.

13. A display panel, comprising:
a driving substrate; and
light-emitting diodes (LEDs) located at a side of the driving substrate,
wherein the driving substrate comprises driving modules, wherein each of the driving modules comprises two electrodes, wherein each of at least one of the two electrodes comprises convex parts, and each of the convex parts protrudes from one of the two electrodes where the convex parts are located towards the other one of the two electrodes;
wherein one of the driving modules corresponds to at least one of the LEDs;
wherein each of the two electrodes comprises a body and the convex parts, and one of the convex parts of one of the two electrodes and one of the convex parts of the other one of the two electrodes form one of convex part groups; and
wherein each of at least one of the convex part groups comprises one of first convex parts that belongs to one of the two electrodes and m second convex parts of second convex parts that belong to the other one of the two electrodes, and the one of the first convex parts is opposite to the m second convex parts, where m is an integer not smaller than 1; and a length L1 of an end of the one of the first convex parts close to the m second convex parts is greater than a length L2 of an end of one of the m second convex parts close to the one of the first convex parts.

14. The display panel according to claim 13, wherein one of the LEDs comprises a first end partially overlapping with one of the first convex parts in a direction perpendicular to a plane of one of the two electrodes, and a second end partially overlapping with one of the second convex parts in the direction perpendicular to the plane of the one of the two electrodes.

15. The display panel according to claim 14, wherein a direction from the first end of the one of the LEDs to the second end of the one of the LEDs is a first direction, and the one of the LEDs has a width L3 in a direction perpendicular to the first direction, where L1≥L3≥L2.

16. The display panel according to claim 14, wherein a direction from the first end of the one of the LEDs to the second end of the one of the LEDs is a first direction, and the one of the LEDs has a width L4 in the first direction; and
wherein, for the one of the driving modules and the at least one of the LEDs corresponding to the one of the driving modules, an edge of a part of one of the two electrodes that is located between two adjacent second convex parts of the second convex parts of the one of the two electrodes is a concave edge; and a distance L5 between an end of one of the first convex parts close to one of the second convex parts and the concave edge is greater than L4.

17. The display panel according to claim 14, wherein the two electrodes are a first electrode and a second electrode, respectively; and the first electrode comprises the first convex parts, and the second electrode comprises the second convex parts;
wherein a minimum distance between two adjacent first convex parts of the first convex parts of the first electrode is a first distance, and a minimum distance between two adjacent second convex parts of the second convex parts of the second electrode is a second distance; and
wherein the at least one of the LEDs comprises at least two LEDs; and for the one of the driving modules and the at least two LEDs corresponding to the one of the driving modules, a distance between two adjacent LEDs of the at least two LEDs is a third distance, where the second distance≥the third distance≥the first distance, and the second distance is not equal to the first distance.

18. The display panel according to claim 14, wherein each of at least one of the LEDs comprises a p-electrode and an n-electrode that are located at a side of the LED close to the driving substrate; and
wherein one of the p-electrode and the n-electrode is in contact with one of the first convex parts, and the other one of the p-electrode and the n-electrode is in contact with one of the second convex parts.

19. The display panel according to claim 14, further comprising:
contact electrodes located at a side of the LEDs facing away from the driving substrate,
wherein each of at least one of the LEDs comprises a p-electrode and an n-electrode that are located at a side of the LED facing away from the driving substrate, and the contact electrodes comprise a first contact electrode in contact with the p-electrode and a second contact electrode in contact with the n-electrode.

* * * * *